United States Patent
Furuya et al.

(10) Patent No.: US 9,588,311 B2
(45) Date of Patent: Mar. 7, 2017

(54) OPTICAL-ASSEMBLY MANUFACTURING METHOD, OPTICAL ASSEMBLY, AND OPTICAL CONNECTOR UNIT

(71) Applicant: SUMITOMO ELECTRIC INDUSTRIES, LTD., Osaka (JP)

(72) Inventors: Akira Furuya, Hadano (JP); Yasunori Murakami, Hiratsuka (JP); Kouichi Koyama, Yokohama (JP); Hiromi Nakanishi, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 45 days.

(21) Appl. No.: 14/693,741

(22) Filed: Apr. 22, 2015

(65) Prior Publication Data
US 2015/0323753 A1 Nov. 12, 2015

(30) Foreign Application Priority Data
May 7, 2014 (JP) .................................. 2014-095709

(51) Int. Cl.
*G02B 6/42* (2006.01)
*G02B 6/26* (2006.01)
(Continued)

(52) U.S. Cl.
CPC .......... *G02B 6/4231* (2013.01); *G02B 6/423* (2013.01); *G02B 6/4239* (2013.01);
(Continued)

(58) Field of Classification Search
CPC Y10T 29/49897; G02B 6/4231; G02B 6/423; G02B 6/4239; G02B 6/4257; G02B 6/4244
See application file for complete search history.

(56) References Cited

U.S. PATENT DOCUMENTS

| 5,420,954 A * | 5/1995 | Swirhun | G02B 6/245 385/24 |
| 6,595,699 B1 * | 7/2003 | Nguyen | G02B 6/4202 385/14 |

(Continued)

OTHER PUBLICATIONS

R. Krishnamurthy, "The Luxtera CMOS Integrated Photonic Chip in a Molex Cable", Chipworks, Dec. 3, 2012. (online).

*Primary Examiner* — Jerry Rahll
(74) *Attorney, Agent, or Firm* — Smith, Gambrell & Russell, LLP.

(57) ABSTRACT

A method for manufacturing an optical-assembly includes the steps of preparing an optical connector including a base having an optical waveguide and a first support block holding a first optical fiber, the base having first and second end surfaces; aligning the optical connector to the optical device, the first end surface of the base facing to the optical device, the first support block being fixed to the base in a removable manner; after aligning the optical connector, fixing the base to the optical device; after fixing the base, removing the first support block from the base; after removing the first support block, re-fixing a second support block to the base, the second end surface of the base facing to the second support block. The second support block has an optical fiber and a through hole. The base has a guide pin inserted to the through hole in the re-fixing step.

8 Claims, 7 Drawing Sheets

(51) Int. Cl.
 *H01L 31/0232* (2014.01)
 *H01S 5/026* (2006.01)
(52) U.S. Cl.
 CPC ......... *G02B 6/4244* (2013.01); *G02B 6/4257* (2013.01); *G02B 6/26* (2013.01); *G02B 6/42* (2013.01); *G02B 6/4249* (2013.01); *H01L 31/0232* (2013.01); *H01S 5/026* (2013.01); *Y10T 29/49897* (2015.01)

(56) References Cited

U.S. PATENT DOCUMENTS

| | | | | |
|---|---|---|---|---|
| 2014/0061979 | A1* | 3/2014 | Numata | G02B 6/3885 264/496 |
| 2014/0341508 | A1* | 11/2014 | Lin | G02B 6/4292 385/33 |
| 2015/0016787 | A1* | 1/2015 | Lin | G02B 6/4204 385/93 |
| 2016/0091679 | A1* | 3/2016 | Chou | G02B 6/4231 385/14 |

* cited by examiner

OPTICAL-ASSEMBLY MANUFACTURING METHOD, OPTICAL ASSEMBLY, AND OPTICAL CONNECTOR UNIT

BACKGROUND OF THE INVENTION

1. Field of the Invention

The present invention relates to a method for manufacturing an optical assembly in which an optical fiber is optically connected to an optical device through an optical connector. The present invention also relates the optical assembly and an optical connector unit.

2. Description of the Related Art

A silicon photonics device in which an electrical element and an optical element are formed on a silicon substrate is described by R. Krishnamurthy in The Luxtera CMOS Integrated Photonic Chip in a Molex Cable [online], Chipworks, Dec. 3, 2012, [searched Apr. 11, 2014], Internet <URL:http://www.chipworks.com/blog/technologyblog/2012/12/03/the-luxtera-cmos-integrated-photonic-chip-in-a-molex-cable/> (hereinafter referred to as Non-Patent Document 1). Such a silicon photonics device is used to transmit and receive light. The silicon photonics device includes grating couplers on its surface to connect the silicon photonics device optically to optical fibers. The optical fibers are glued to a fiber holder with an epoxy resin, and the fiber holder is attached to the top of the silicon photonics device.

SUMMARY OF THE INVENTION

According to an aspect of the present invention, there is provided a method for manufacturing an optical assembly in which an optical fiber is optically connected to an optical device through an optical connector. The method includes the steps of (a) preparing an optical connector including a base having an optical waveguide, a first support block holding a first optical fiber, and a second support block holding a second optical fiber, the base having a first end surface and a second end surface opposed to the first end surface; (b) aligning the optical connector so as to optically connect the optical waveguide of the base to the optical device while the first end surface of the base is faced to the optical device, the first support block being fixed to the base of the optical connector in a removable manner; (c) after aligning the optical connector, fixing the base of the optical connector to the optical device; (d) after fixing the base to the optical device, removing the first support block from the base; (e) after removing the first support block, re-fixing the second support block to the base while the second end surface of the base is faced to the second support block so as to optically connect the optical waveguide to the optical fiber. The optical waveguide is exposed at the first and second end surfaces, the first and second support blocks have a through hole, the base has a guide pin, and in the step of re-fixing the second support block to the base, the second support block is fixed to the base by inserting the guide pin of the base into the through hole of the second support block.

DESCRIPTION OF THE PREFERRED EMBODIMENTS

Figure 1:
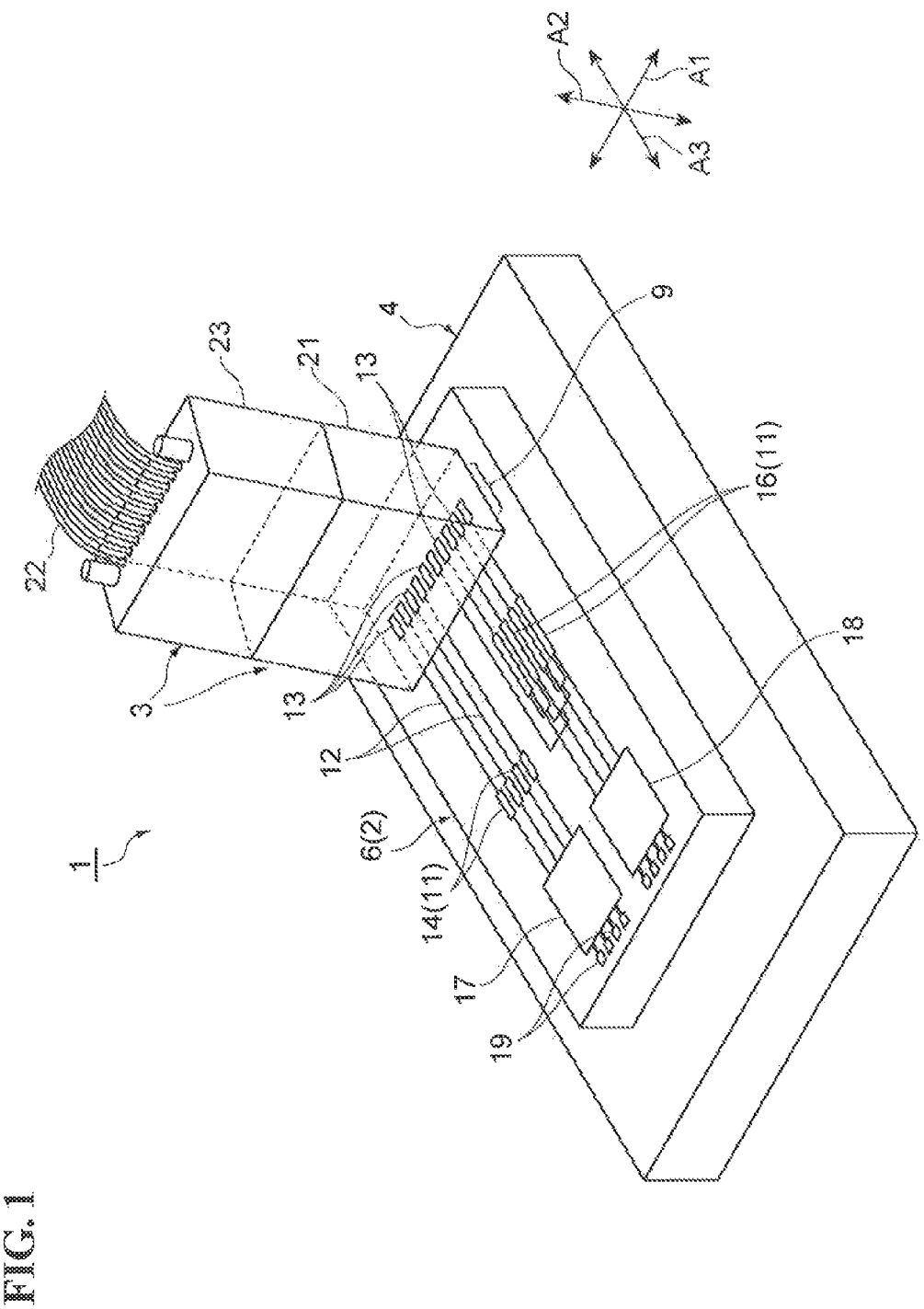
FIG. 1 is a perspective view illustrating the state in which an optical assembly according to an embodiment of the present invention is mounted on a main circuit board.

According to an aspect of the present invention, there is provided an optical assembly in which an optical fiber is optically connected to an optical device through an optical connector. The method for manufacturing the optical assembly includes steps of (a) preparing an optical connector including a base having an optical waveguide, a first support block holding a first optical fiber, and a second support block holding a second optical fiber, the base having a first end surface and a second end surface opposed to the first end surface; (b) aligning the optical connector so as to optically connect the optical waveguide of the base to the optical device while the first end surface of the base is faced to the optical device, the first support block being fixed to the base of the optical connector in a removable manner; (c) after aligning the optical connector, fixing the base of the optical connector to the optical device; (d) after fixing the base to the optical device, removing the first support block from the base; (e) after removing the first support block, re-fixing the second support block to the base while the second end surface of the base is faced to the second support block so as to optically connect the optical waveguide to the optical fiber. The optical waveguide is exposed at the first and second end surfaces, the first and second support blocks have a through hole, the base has a guide pin, and in the step of re-fixing the second support block to the base, the second support block is fixed to the base by inserting the guide pin of the base into the through hole of the second support block.

According to this method, the optical fiber is optically connected to the optical device via the optical waveguide of the base. In the step of aligning the optical connector, the optical waveguide is optically connected to the optical device. In the step of re-fixing the second support block to the base, the optical waveguide of the base is optically connected to the optical fiber.

The above-described method may further include a step of assembling the optical device with an electrical component, after the step of removing the first support block, and before the step of re-fixing the second support block. According to this method, in the step of assembling, the optical device is not accompanied with any optical fibers. This is because the first optical fiber held in the first support block is removed from the base before the step of assembling, and the second optical fiber held in the second support block is connected to the base after the step of assembling. Thus, in the step of assembling, the optical device is easily handled. In addition, in the step of assembling, the optical device can be provided to heating process such as soldering.

In the above-described method, the optical device may include a photodiode, and in the step of aligning the optical connector, the optical waveguide of the base may be aligned to the optical device by receiving a light introduced into the first optical fiber with the photodiode.

In the above-described method, the first support block may include a third end surface facing to the base, and a fourth end surface opposed to the third end surface. The first support block may be fixed to the base by attaching a fixing block on the fourth end surface in the step of aligning the optical connector. The fixing block has a first hole corresponding to the guide pin of the base, a second hole intersecting with the first hole, and a fist pin inserted in the second hole. The guide pin of the base is fixed in the first hole of the fixing block by the first pin inserted through the second hole.

In the above-described method, the second support block may be fixed to the base by using an adhesive resin in the step of re-fixing the second support block to the base. According to this method, the optical waveguide of the base and the second optical fiber of the second support block are fixed in an irremovable manner.

In the above-described method, the second support block may include a third end surface facing to the base, a fourth end surface opposed to the third end surface, and a protecting plate. The protecting plate may be disposed above the fourth end surface. The first optical fiber protrudes from the fourth end surface extending in a first direction. The protecting plate may change a direction in which the second optical fiber extends from the first direction to a second direction intersecting with the first direction.

In the above-described method, the optical device may include a plurality of photodiodes and a plurality of modulators. The base may include a plurality of optical waveguides. The first support block may include a plurality of first optical fibers, and the second support block may include a plurality of second optical fibers. The plurality of optical waveguides are optically connected to the plurality of first or second optical fibers. In the step of aligning the optical connector, one of the plurality of optical waveguides is aligned to the optical device by receiving a light introduced into one of the plurality of first optical fibers with one of the plurality of photodiodes.

In the above-described method, the second support block may be the same as the first support block.

According to another aspect of the present invention, an optical connector unit includes an optical connector including a base having an optical waveguide, and a support block holding an optical fiber. The base has a first end surface and a second end surface opposed to the first end surface. The optical waveguide is exposed at the first and second end surfaces. The second end surface faces to the support block. The support block has a through hole. The base has a guide pin. The optical waveguide is optically connected to the optical fiber by the through hole and the guide pin inserted in the through hole.

With this optical connector unit, the base having the optical waveguide and the support block holding the optical fiber are the separate components. The optical connector is used to connect an optical fiber optically to an optical device. According to the above-mentioned optical connector, the support block can be removed after the base is fixed to the optical device. In addition, the optical waveguide is optically connected to the optical fiber by inserting the guide pin into the through hole. Thus, the optical connection between the optical waveguide and the optical fiber is easily obtained.

According to the above-described optical connector unit, the support block may include a third end surface facing to the base, and a fourth end surface opposed to the third end surface. The support block is fixed to the base by attaching a fixing block on the fourth end surface. The fixing block has a first hole corresponding to the guide pin of the base, a second hole intersecting with the first hole, and a fist pin inserted in the second hole. The guide pin of the base is fixed in the first hole of the fixing block by the first pin inserted through the second hole.

According to the above-described optical connector unit, the support block may include a third end surface facing to the base, a fourth end surface opposed to the third end surface, and a protecting plate. The protecting plate may be disposed above the fourth end surface. The optical fiber extends in a first direction on the fourth end surface. The protecting plate may change a direction in which the optical fiber extends from the first direction to a second direction intersecting with the first direction.

According to the above-described optical connector unit, the base may include a plurality of optical waveguides and a plurality of guide pins. The support block may include a plurality of optical fibers and a plurality of through holes. The plurality of optical waveguides are optically connected to the plurality of optical fibers. The plurality of guide pins are inserted into the plurality of through holes.

According to another aspect of the present invention, an optical assembly includes an optical device and an optical connector optically coupled to the optical device. The optical connector includes a base having an optical waveguide, and a support block holding an optical fiber. The base has a first end surface and a second end surface opposed to the first end surface. The optical device includes an upper surface. The optical waveguide is exposed at the first and second end surfaces of the base. The optical waveguide is optically connected to the optical device by facing the first end surface to the upper surface of the optical device. The optical waveguide is optically connected to the optical fiber by facing the second end surface to the support block. The support block has a through hole, and the base has a guide pin. The support block is fixed to the base by inserting the guide pin of the base into the through hole of the support block.

With this optical assembly, since the base and the support block are the separate components. The support block can be removed in the manufacturing steps as necessary.

A method of manufacturing an optical assembly, an optical assembly, and an optical connector unit according to a first embodiment of the present invention will be described with reference to the accompanying drawings. In the description of the drawings, the same components are denoted by the same reference numerals, and redundant descriptions are thus omitted. The present invention is not limited to the following description, and is defined by the claims. The present invention is intended to include all equivalents to the scope of the claims and modifications within the scope of the claims.

As illustrated in FIG. 1, an optical assembly 1 includes a silicon photonics device (optical device) 2 and an optical connector 3. The optical assembly 1 is mounted on a main circuit board 4 on which electric components and other optical devices are mounted.

The silicon photonics device 2 are disposed on a silicon substrate 6. The device 2 includes a light coupling portion 9 disposed on the upper surface of the substrate 6. The light coupling portion 9 receives and emits light from/to the optical connector 3. The device 2 receives an signal light through the optical connector 3, converts the signal light into an electrical signal, and outputs the electrical signal. Also, the device 2 receives an electrical signal from an electric components mounted on the circuit board 4, converts the electrical signal into an signal light, and outputs the signal light to the optical connector 3. The device 2 includes a photoelectric transducer 11 and optical waveguides 12 disposed on the substrate 6. The photoelectric transducer 11 includes photodiodes 14 which convert a light to a photocurrent. The transducer 11 also includes optical modulators 16 which convert an electrical signal into an signal light. The optical waveguides 12 optically connect the light coupling portion 9 to the photoelectric transducer 11.

The light coupling portion 9 includes a grating couplers 13. Ten grating couplers 13 are arranged in a predetermined direction A1 at a pitch of 250 µm. The grating couplers 13 receive and emit light in a direction at an angle of 8 degrees with respect to the direction of the normal to the upper surface of the substrate 6. The size of the grating couplers 13 corresponds to a beam diameter of 8 µm, which substantially matches the mode diameter of optical fibers retained by the optical connector 3. Four of the grating couplers 13 receive light from the optical fibers. Four of the grating couplers 13 emit light to another optical fibers. One of the grating couplers 13 is used to supply continuous light, which serves as carrier light, to the photoelectric transducer 11. One of the grating couplers 13 is used to supply continuous light to one of the photodetectors 14, which serves as a light used to determine the alignment of the device 2 and the optical connector 3.

The photoelectric transducer 11 includes four photodiodes 14 arranged in the predetermined direction A1. The photodiodes 14 are optically connected to four of the grating couplers 13 by the optical waveguides 12. The photoelectric transducer 11 also includes four optical modulators 16 arranged in the predetermined direction A1. The optical modulators 16 are optically connected to four of the grating couplers 13 by the optical waveguides 12. The carrier light supplied from one of the grating couplers 13 is divided into four components, which are supplied to the respective optical modulators 16. The optical modulators 16 modulate the components of the carrier light on the basis of electrical signals (modulation signals).

The silicon photonics device 2 includes a transimpedance amplifier 17 and a driver 18. The transimpedance amplifier 17 receives photo-currents from the photodiodes 14 and amplifies the electrical signals. The driver 18 applies electrical signals to the optical modulators 16. The device 2 also includes a plurality of connection terminals 19 for transmitting/receiving electrical signals to/from the transimpedance amplifier 17 and the driver 18.

The optical connector 3 includes a base block (base) 21 and a support block 23. The base 21 is fixed to the silicon photonics device 2, and a support block 23 holds a plurality of optical fibers 22. The support block 23 is attached to the base 21.

Figure 2:
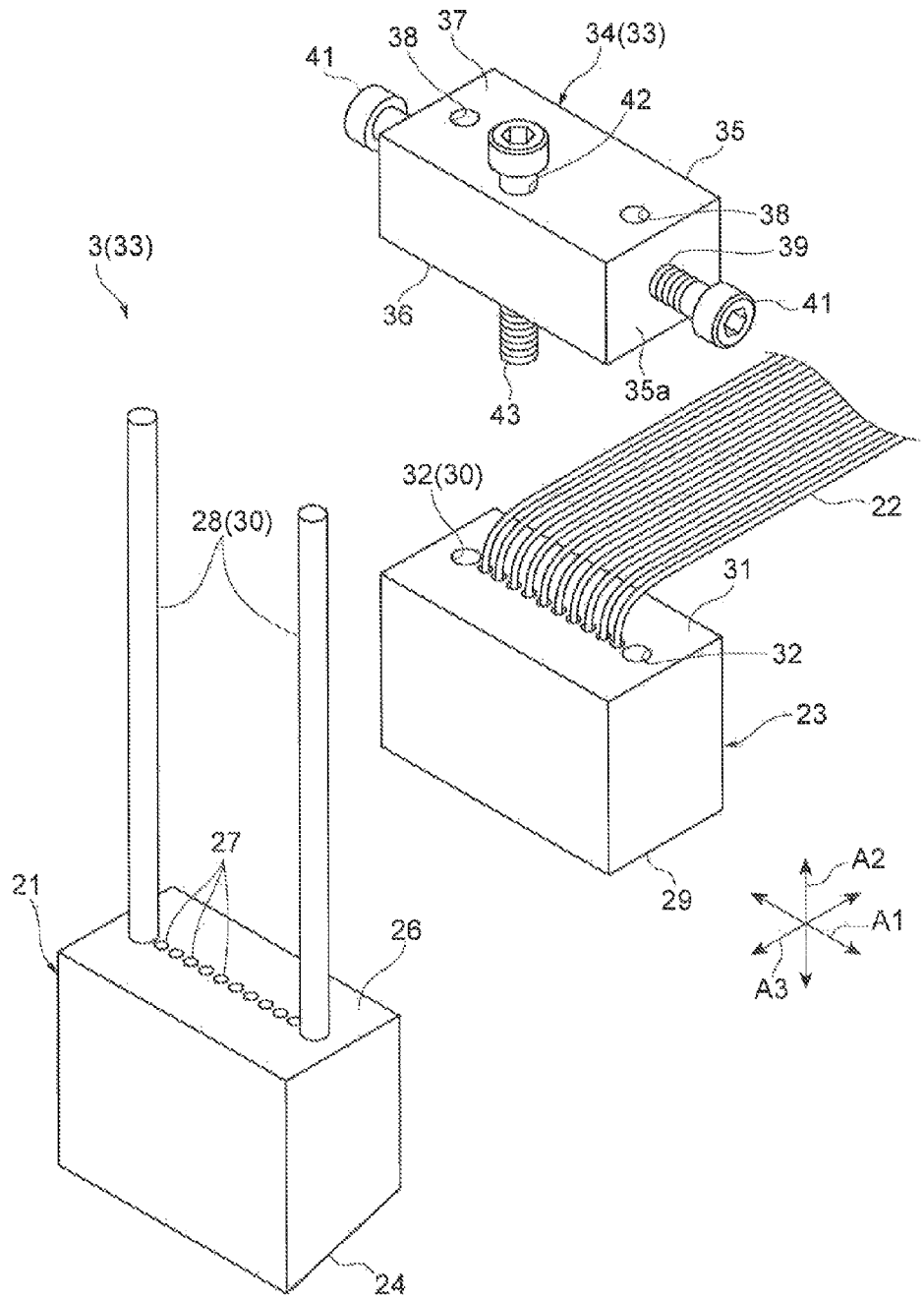
FIG. 2 is a perspective view of an optical connector unit according to the embodiment of the present invention.

As illustrated in FIG. 2, the base 21 has almost rectangular-parallelepiped-shape. The base 21 has a first end surface 24 and a second end surface 26. The first end surface 24 faces the device 2 and is fixed to the upper surface of the device 2. The second end surface 26 faces to the support block 23. The length from the first end surface 24 to the second end surface 26 is about 3 mm. The first end surface 24 and the second end surface 26 are optically flat (polished).

The base 21 includes optical waveguides 27 that extend from the first end surface 24 to the second end surface 26. The optical waveguides 27 are exposed at the first end surface 24 and at the second end surface 26. The optical waveguides 27 are formed of, for example, optical fibers having a length of 3 mm. Ten optical waveguides 27 are arranged in the predetermined direction A1 at a pitch of 250 µm. The optical waveguides 27 are optically connected to the respective grating couplers 13 of the device 2. The first end surface 24 is at an angle of 8 degrees with respect to a plane that is orthogonal to the optical waveguides 27 (see FIG. 5A). The first end surface 24 is attached to the upper surface of the substrate 6 of the device 2, so that light from the optical waveguides 27 is incident on the grating couplers 13 in a direction at an angle of 8 degrees with respect to the direction of the normal to the upper surface of the substrate 6. Also, light emitted from the grating couplers 13 in a direction at an angle of 8 degrees with respect to the direction of the normal to the substrate 6 can be received by the optical waveguides 27.

Polyphenylene sulfide containing silica filler (material of MT connectors) is used as the material of the base 21. Alternatively, a glass material having a high heat resistance is used as the material of the base 21. In the case where a glass material is used, the base 21 is formed as follows. That is, two block members having V-grooves are prepared, and optical fibers that serve as the optical waveguides 27 are arranged in the V-grooves in one of the block members. Then, the two block members are bonded together by using a thermosetting adhesive, so that the base 21 is completed. In the case where a glass material having a high heat resistance is used, degradation of the base 21 does not occur even at a reflow temperature (temperature as high as 260° C. to 280° C.) applied to mount the device 2 on the main circuit board 4. Thus, the base 21 may be configured to have a high heat resistance.

The base 21 includes a pair of guide pins 28. The guide pins 28 are arranged such that the optical waveguides 27 are disposed therebetween. In the case where the base 21 is made of Polyphenylene sulfide, the guide pins 28 are formed by integral molding together with the optical fibers that function as the optical waveguides 27. In the case where the base 21 is made of glass, the guide pins 28 are arranged in V-grooves formed in block members. The guide pins 28 function as portions of an aligning structure 30.

The support block 23 is rectangular-parallelepiped-shaped. The support block 23 holds the optical fibers 22 such that the optical fibers 22 are arranged in the predetermined direction A1 at a pitch of 250 µm. In other words, the support block 23 holds the optical fibers 22 such that the optical axes of the optical fibers 22 are arranged at the same pitch as that of the optical waveguides 27 of the base 21. The support block 23 is made of polyphenylene sulfide containing silica filler, which is a material of MT connectors.

Figure 3:
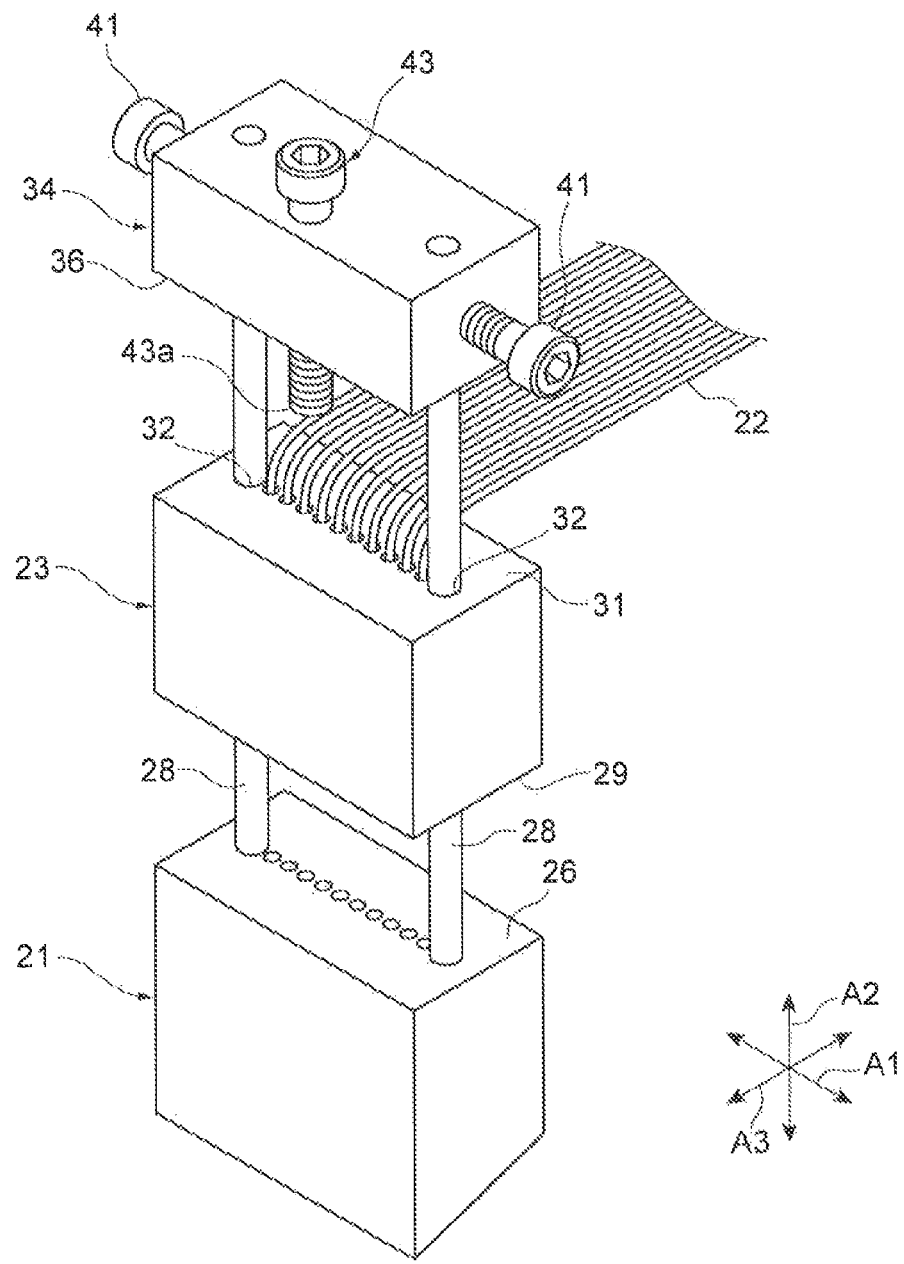
FIG. 3 is a perspective view of the optical connector unit according to the embodiment of the present invention.

As illustrated in FIG. 3, the support block 23 is disposed on the base 21. The support block 23 includes a third end surface 29 and a fourth end surface 31. An end surface of each optical fiber 22 at a first end thereof is exposed at the third end surface 29. A second end of each optical fiber 22 projects from the fourth end surface 31. The length from the third end surface 29 to the fourth end surface 31 is about 3 mm. Thus, the optical fibers 22 are embedded in the support block 23 so as to extend from the fourth end surface 31 to the third end surface 29. The second ends of the optical fibers 22 extend from the fourth end surface 31, and are bundled together by an MT connector (not shown) or the like. The third end surface 29 is optically flat (polished).

The support block 23 has a pair of guide holes (through holes) 32 that correspond to the pair of guide pins 28. The guide holes 32 extend through the support block 23 from the third end surface 29 to the fourth end surface 31. The pair of guide pins 28 and the pair of guide holes 32 form the aligning structure 30. The inner diameter of the guide holes 32 is slightly greater than the outer diameter of the guide pins 28. Therefore, the guide pins 28 can be inserted through the guide holes 32. The difference between the inner diameter of the guide holes 32 and the outer diameter of the guide pins 28 is, for example, 1 μm or less. Accordingly, the positioning accuracy of the aligning structure 30 may be set to ±1 μm or less. The guide holes 32 are arranged such that the optical fibers 22 are disposed therebetween in the direction in which the optical fibers 22 are arranged. More specifically, the centers of the guide holes 32 and the optical axes of the optical fibers 22 are aligned on a single straight line. When the guide pins 28 are inserted through the guide holes 32, the third end surface 29 of the support block 23 comes into contact with the second end surface 26 of the base 21. At this time, the distal ends of the guide pins 28 project from the fourth end surface 31 of the support block 23. In other words, the length of the guide pins 28 is greater than the length of the support block 23 from the third end surface 29 to the fourth end surface 31.

When the guide pins 28 are inserted into the guide holes 32, the relative position between the optical waveguides 27 of the base 21 and the optical fibers 22 of the support block 23 is determined. More specifically, the positions of the optical waveguides 27 and the optical fibers 22 on a plane orthogonal to the optical axes thereof are determined. When the guide pins 28 are inserted through the guide holes 32, the optical axes of the optical waveguides 27 coincide with the optical axes of the respective optical fibers 22. Owing to the aligning structure 30, the base 21 and the support block 23 are arranged such that the optical waveguides 27 and the optical fibers 22 are positioned relative to each other at an accuracy of, for example, ±1 μm or less.

Figure 4:
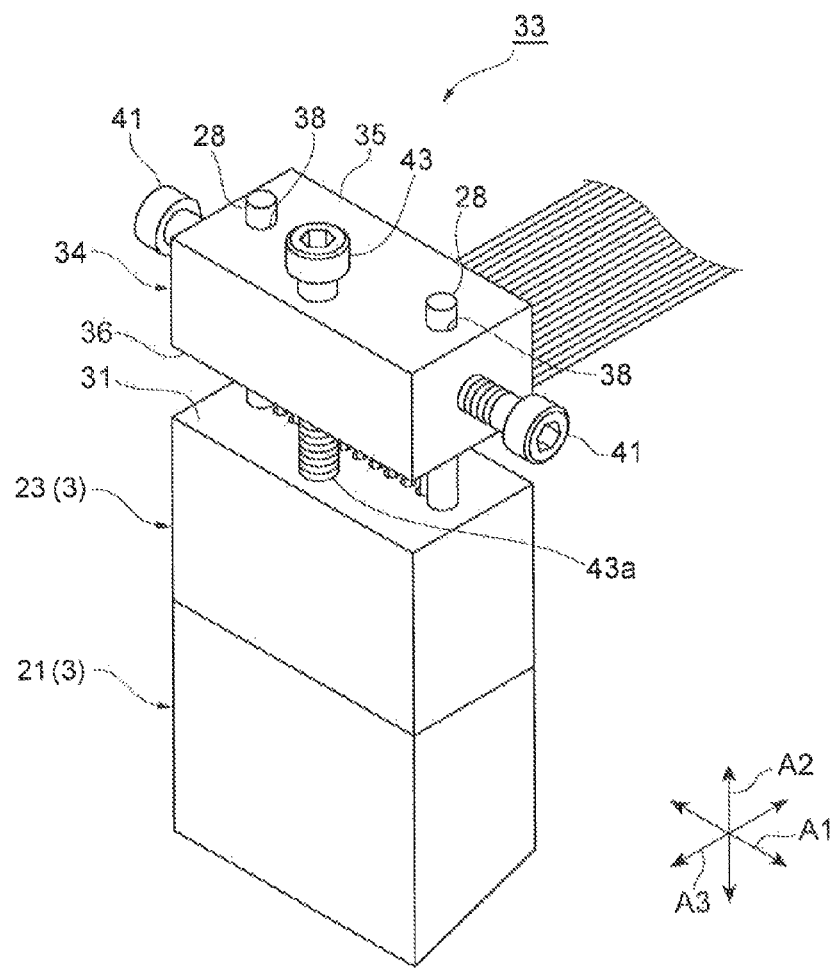
FIG. 4 is a perspective view of the optical connector unit according to the embodiment of the present invention.

As illustrated in FIG. 4, an optical connector unit 33 also includes a fixing block 34 in addition to the optical connector 3. The fixing block 34 pushes the support block 23 against the base 21. The fixing block 34 holds the guide pins 28 so as to fix the position of the fixing block 34 with respect to the base 21. While holding the guide pins 28, the fixing block 34 pushes the support block 23 against the base 21. Accordingly, the third end surface 29 of the support block 23 is pressed against the second end surface 26 of the base 21. Thus, the relative position in the optical axis direction A2 between the optical waveguides 27 and the optical fibers 22 can be maintained constant.

The fixing block 34 includes a rectangular-parallelepiped-shaped body 35. The body 35 has a fifth end surface 36 and a sixth end surface 37. The fifth end surface 36 faces the fourth end surface 31 of the support block 23. The sixth end surface 37 is at a side opposite to the side of the fifth end surface 36. The body 35 has a pair of second holes 38 that correspond to the pair of guide pins 28. The first holes 38 are through holes that extend from the fifth end surface 36 to the sixth end surface 37.

As illustrated in FIG. 2, the body 35 of the fixing block 34 also has second holes 39. The second holes 39 extend from side surfaces 35a to the first holes 38. The second hole 39 intersects with the first hole 38. The second holes 39 extend in a direction (predetermined direction A1) that crosses the direction in which the guide pins 28 extend. Preferably, the second holes 39 are orthogonal to the guide pins 28. The fixing block 34 includes first screws (first pins) 41 that are screwed into the second holes 39. The first screws 41 are thin screws, such as M1.2 screws. As illustrated in FIG. 4, the ends of the first screws 41 come in contact with the guide pins 28 inserted through the first holes 39. The end faces of the first screws 41 press the guide pins 28 against the inner peripheral surfaces of the first holes 38 in a direction orthogonal to the direction in which the guide pins 28 extend. Thus, the fixing block 34 holds the guide pins 28 of the base 21. In other words, the fixing block 34 is fixed to the base 21.

As illustrated in FIG. 2, the body 35 also has a third hole 42 that is parallel to the direction in which the first holes 38 extend (optical axis direction A2). The third hole 42 is a screw hole that extends from the fifth end surface 36 to the sixth end surface 37. The third hole 42 is formed at a position shifted from an imaginary line that connects the center axes of the first holes 38. In other words, the third hole 42 is formed so as not to overlap the optical fibers 22 of the support 23. The fixing block 34 includes a second screw (a second pin) 43 that is screwed into the third hole 42. The second screw 43 is a thin screw, such as an M1.2 screw. As illustrated in FIG. 4, when the second screw 43 is screwed into the third hole 42 while the body 35 is fixed to the guide pins 28, the end of the second screw 43 comes into contact with the fourth end surface 31 of the support block 23. When the second screw 43 is further screwed into the third hole 42, a pressing force that pushes the support block 23 against the base 21 is generated. Thus, by using the second screw 43, the pressing force can be easily controlled by controlling the amount by which the second screw 43 is rotated.

Next, a method for manufacturing the optical assembly 1 will be described. First, a step of preparing an optical connector 3 is performed. The optical connector 3 having a base 21 and the first support block 23 is prepared. The base 21 includes the optical waveguides 27. The optical waveguides 27 are exposed at the first surface 24 of the base 21. The optical waveguides 27 are also exposed at the second end surface 26 of the base 21. The first surface 24 is on the opposite side of the base 21 to the second end surface 26. The first support block 23 holds first optical fibers 22. The first optical fibers 22 are exposed on the third end surface 29 of the first support block 23. In addition, the base 21 has a pair of guide pins 28. The first support block has a pair of guide holes 32. The second support block 23 is also prepared in this step. The second support block 23 also holds second optical fibers 22, and has a pair of guide holes 32.

Next, a step of aligning the optical connector 3 to the optical device 2 is performed. The first support block 23 is fixed to the base 21 in a removable manner. More specifically, as illustrated in FIG. 3, the guide pins 28 are inserted into the guide holes 32. The third end surface 29 faces to the second end surface 26. The guide pins 28 are also inserted in the first holes 38 of the fixing block 34. As illustrated in FIG. 4, the third end surface 29 is attached to the second end surface 26. The second screw 43 is inserted in the third hole 42 of the fixing block 34. As illustrated in FIG. 3, an end 43a of the second screw 43 is arranged so as to project by the predetermined amount from the fifth end surface 36 of the fixing block 34. There is a gap between the fourth end surface 31 and the fifth end surface 36. Thus, the first optical fiber 22 can bend and change the extending direction in the gap. The first screws 41 are inserted into the second holes 39 until the heads of the first screws 41 come in contact with the guide pins 28. Thus, the fixing block 34 and the base 21 are fixed with each other. The first support block 23 and the base are also fixed with each other by the guide pins 28 and the guide holes 32 in a removable manner. Next, the second screw 43 is screwed deeply toward the first support block 23. Thus, the first support block 23 is pushed toward the base 21.

Next, the first end surface 24 of the base 21 is faced to the upper surface of the optical device 2. The optical waveguides 27 exposed at the first end surface 24 are positioned near the grating coupler 13 (light coupling portion 9) of the device 2. Then, a light is introduced into one of the first optical fibers 22 from the second end of the first optical fiber 22 projects from the fourth end surface 31 of the first support block 23. The light is output from the optical waveguide 27 at the first end surface 24. The active optical alignment is performed using the light so as to the optical waveguide 27 is optically connected to the grating coupler 13. More specifically, the position of the base 21 is moved to search the alignment position where the light emitted from the first end surface 24 is incident on the grating couplers 13. The light is detected by the photodiode 14 in the optical device 2. The relative position between the optical connector 3 and the optical device 2 is adjusted so that the photo-current output from the photodiode 14 is maximized.

Alternatively, in the step of aligning, the position of the optical device 2 may be moved relative to the base 21. In the step of aligning, the device 2 may either be attached to the main circuit board 4 (see FIG. 1) or be in the form of a so-called bare chip that is not attached to a board.

Figure 5A:
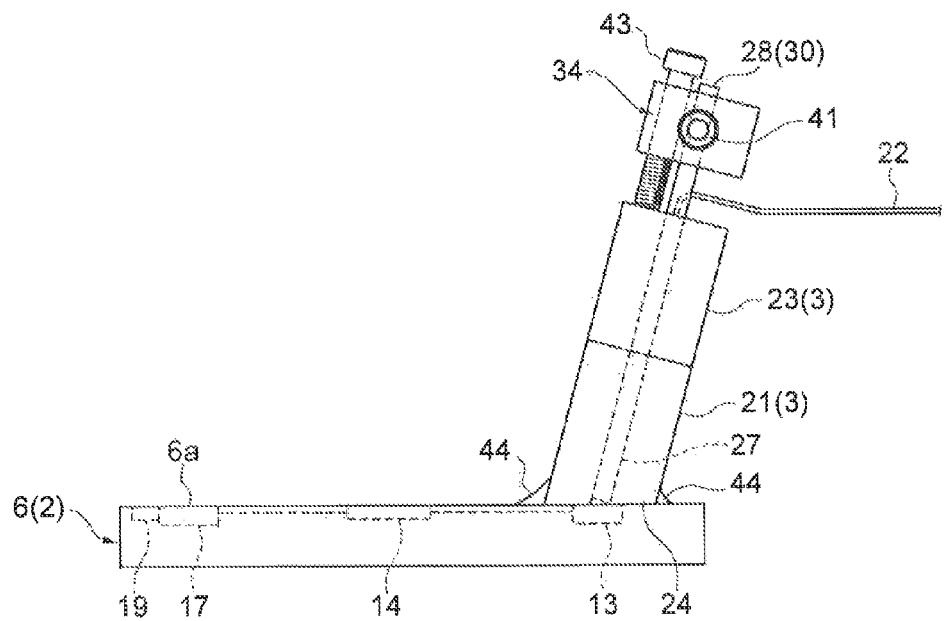
FIGS. 5A and 5B are side views illustrating steps of a manufacturing process of the optical assembly according to the embodiment of the present invention.

After aligning the optical connector 3, a step of fixing the base 21 to the optical device 2 is performed. As illustrated in FIG. 5A, the base 21 is permanently fixed to the surface of the optical device 2 by using an adhesive resin 44. The adhesive resin 44 is an ultraviolet (UV) curable resin. In the case where the base 21 is made of a material having a high heat resistance, an adhesive resin having a high heat resistance, such as an epoxy resin which has both UV curing and thermosetting characteristics, can be used.

Figure 5B:
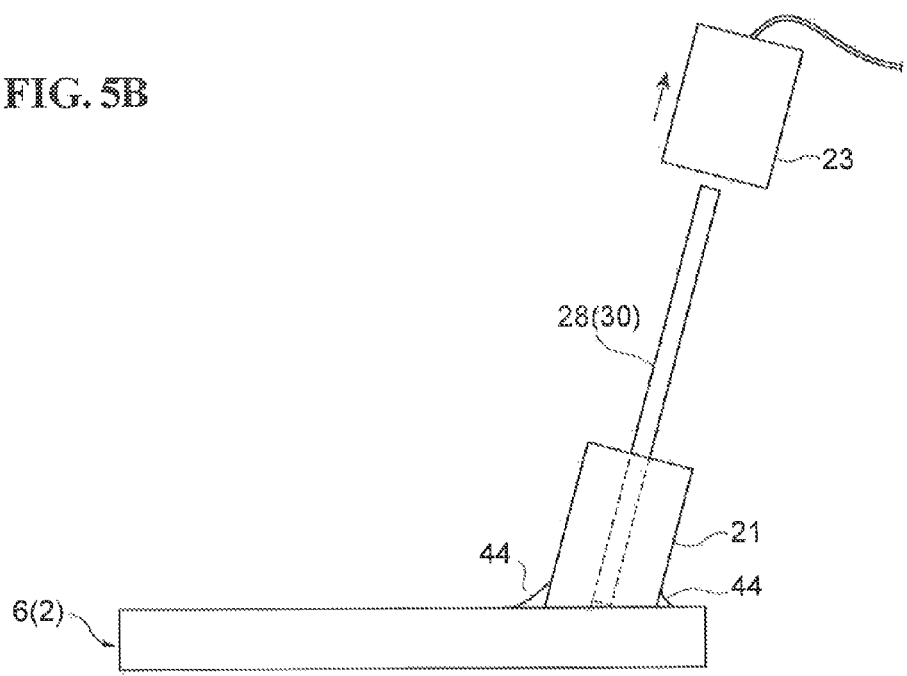

Next, a step of removing the first support block 23 is performed. As illustrated in FIG. 5B, the first support block 23 is removed from the base 21. More specifically, the second screw 43 is loosened, and then the first screws 41 are loosened. Then, the fixing block 34 is removed. The first support block 23 is pulled away from the guide pins 28 of the base 21. Since the first support block 23 has been temporarily attached to the base 21 by being fixed by the fixing block 34, the first support block 23 can be easily removed from the base 21 when the fixing block 34 is removed.

Figure 6A:
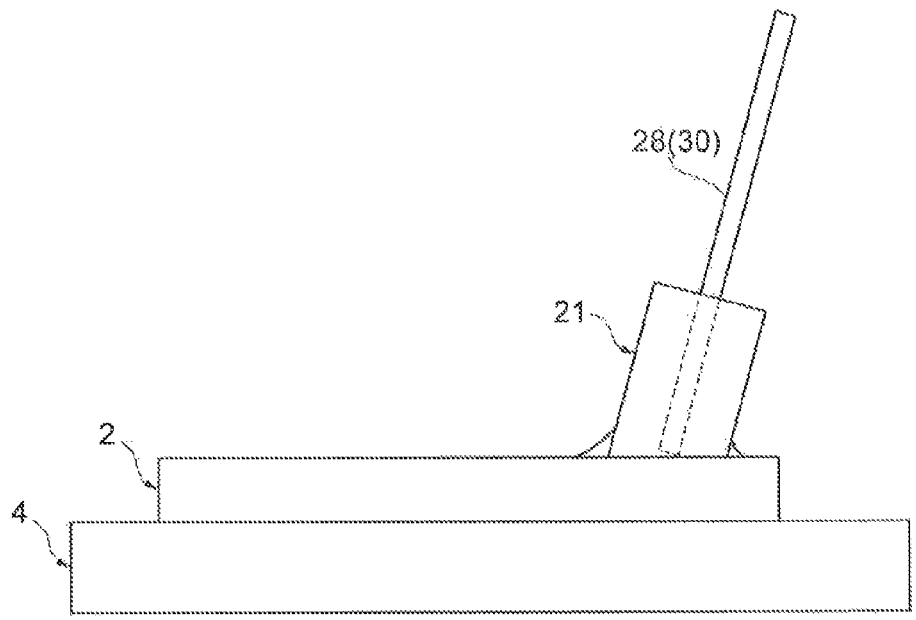
FIGS. 6A and 6B are side views illustrating steps of the manufacturing process of the optical assembly according to the embodiment of the present invention.

Next, as illustrated in FIG. 6A, a step of assembling the optical device 2 with electrical components such as circuit boards is performed. In the step of assembling, the device 2 is mounted on the main circuit board 4. Other electrical components or optical components may be mounted on the device 2. In the step of assembling, the device 2 accompanied with the base 21 is exposed to high temperature such as the soldering reflow temperature. As the device 2 in this step is not accompanied with any optical fibers, the device 2 is easily handled even under the high temperature. The curing of the adhesive resin 44 may be included in the step of assembling.

Figure 6B:
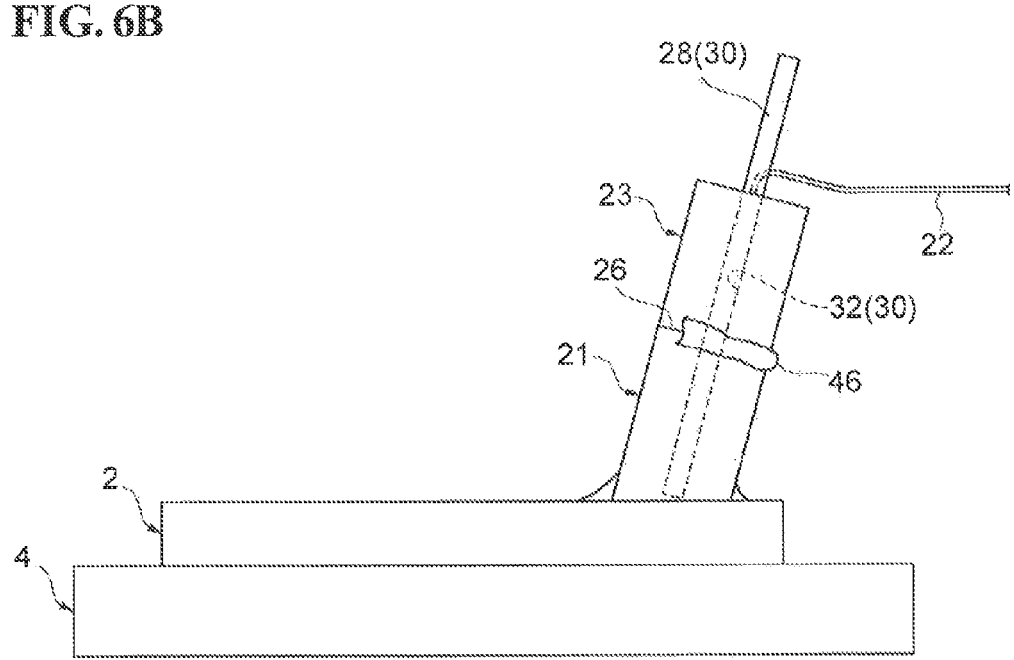

Next, as illustrated in FIG. 6B, a step of re-fixing the second support block 23 to the base 21 is performed. The second support block 23 is arranged so that the third end surface of the second support block faces to the second end surface 26 of the base 21. The guide pins 28 of the base 21 are inserted into the guide holes 32 of the second support block 23. The second optical fibers 22 of the second support block 23 are optically connected to the optical waveguides 27 at the accuracy of relative position between the guide holes 32 and the guide pins 28. Then, an adhesive resin 46 is applied to fix the second support block 23 to the base 21. Thus, the second support block 23 is fixed to the base 21 in an irremovable manner. When the adhesive resin 46 is applied and cured, the second support block 23 is pressed against the base 21 by using the fixing block 34. In this case, the fixing block 34 is removed after the adhesive resin 46 is cured.

The second support block 23 used in the re-fixing step may be the same as the first support block 23 which is removed in the former step. Alternatively, the second support block 23 may be a different one from the first support block 23.

In the above-described method for manufacturing the optical assembly, the optical waveguides 27 are optically connected to the grating couplers 13 in the aligning step. The first optical fibers 22 introduce the light into the optical waveguides 27 used for aligning. The base 21 is fixed to the device 2 at the alignment position in the fixing step. Then, the first support block 23 and the first optical fibers 22 are removed from the base 21 and from the optical device 2. Only the base 21, which does not retain the optical fibers 22, is fixed to the device 2 after the removing step. Thus, the optical device 2 is handled easily in the step of assembling because the device 2 is not accompanied with optical fibers which is fragile and weak for heat.

Since the support block 23 is pressed against the base 21 using the fixing block 34, the optical connection between the optical waveguides 27 and the optical fibers 22 is stable during the step of aligning the base 21 and the device 2.

According to the optical connector unit 33, since the support block 23 is pressed against the base 21 by the fixing block 34, the relative position between the base 21 and the support block 23 is stable. Therefore, the optical connection between the optical waveguides 27 and the optical fibers 22 is ensured.

According to the optical assembly 1, the base 21, which is fixed to the optical device 2, and the support block 23, which hold the optical fibers 22, are formed as separate components. Therefore, the support block 23 can be removed after the base 21 is fixed to the optical device 2.

Figure 7A:
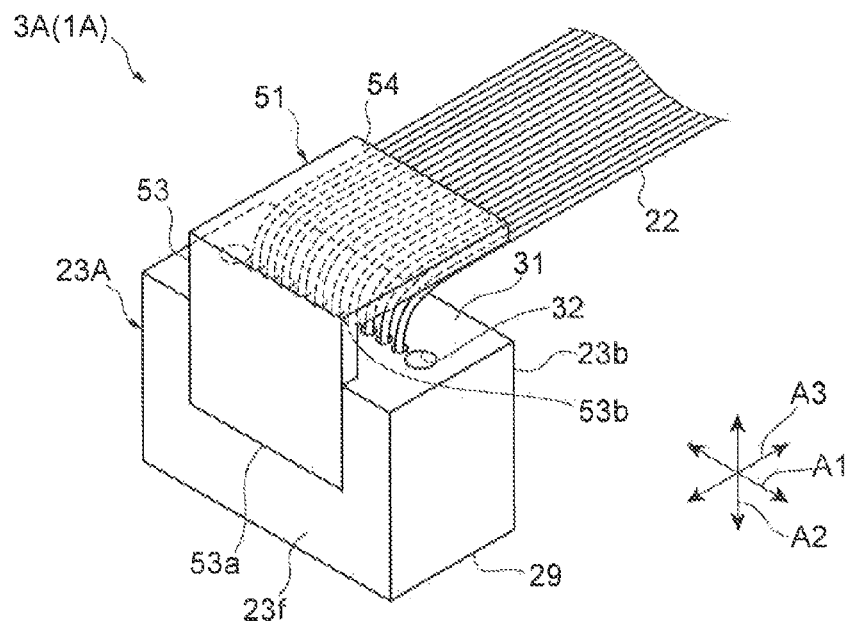
FIGS. 7A and 7B illustrate an optical connector according to a second embodiment of the present invention.
Figure 7B:
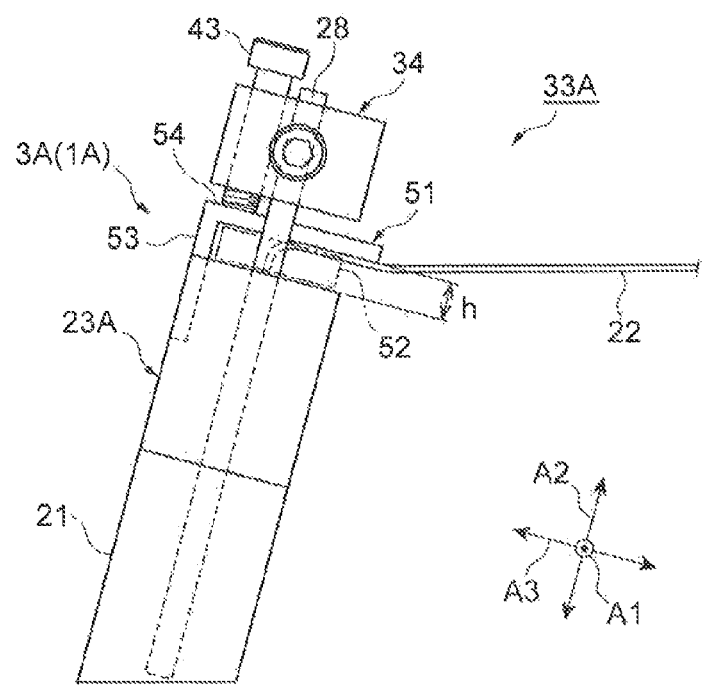

Next, a second embodiment of the present invention will be described. As illustrated in FIGS. 7A and 7B, a support block 23A of an optical connector 3A according to the second embodiment includes a protecting plate 51. In this point, the optical connector 3A differs from the optical connector 3 according to the first embodiment. Other structures of the optical connector 3A are similar to those of the optical connector 3. In addition, an optical assembly 1A is manufactured by a method similar to the method for manufacturing the optical assembly 1.

The support block 23A includes the protecting plate 51 which is L-shaped. The protecting plate 51 forms a space 52 above a fourth end surface 31 of the support block 23A (see FIG. 7B). The optical fibers 22 are bent in the space 52. The optical fibers 22 protrude from the fourth end surface 31 of the support block 23A and extend in an optical axis direction A2. The protecting plate 51 changes the direction in which the optical fibers 22 extend. After being bent by the protecting plate 51, the optical fiber 22 extend in a direction A3 orthogonal to the direction A2. The protecting plate 51 protects optical fibers 22 from being broken. The protecting plate 51 includes a connecting plate 53 and a roof plate 54. The connecting plate 53 is fixed to the support block 23A at one end thereof. The connecting plate 53 extends in the optical axis direction A2. An end portion 53a of the connecting plate 53 is attached to a front surface 23f, which is orthogonal to the fourth end surface 31. The other end portion 53b of the connecting plate 53 projects from the fourth end surface 31. The roof plate 54 extends from the end portion 53b of the connecting plate 53 in a direction A3 orthogonal to the direction in which the connecting plate 53 extends. The roof plate 54 extends over a region from the front surface 23f to a rear surface 23b of the support block 23A.

As illustrated in FIG. 7B, in an optical connector unit 33A, a second screw 43 of a fixing block 34 is pressed against the roof plate 54 of the protecting plate 51. In this case, the second screw 43 comes into contact with the roof plate 54 of the protecting plate 51 at a position close to the connecting plate 53. Accordingly, the second screw 43 presses a portion of the roof plate 54 that has a high rigidity. Therefore, the pressing force can be efficiently transmitted to the support block 23A. In addition, deformation of the roof plate 54 by the second screw 43 can be suppressed. As a result, the height h of the space 52 can be maintained, and the optical fibers 22 can be reliably protected.

Owing to the protecting plate 51, the space 52 is formed between the fourth end surface 31 and the roof plate 54. The height of the space 52, that is, the height "h" from the fourth end surface 31 to the roof plate 54, is set as the same or slightly larger than the minimum bending radius of the optical fibers 22. Here, the minimum bending radius is the smallest bending radius at which the optical fibers do not break for a long time. For example, when the outer diameter of cladding glass of the optical fibers 22 is 80 μm, the minimum bending radius of the optical fibers 22 is 3 mm. In this case, the height "h" is set to 3 mm. When the protecting plate 51 is used, the bending radius of the optical fibers 22 is maintained at the constant value within a range in which the optical fibers 22 do not break for a long time. Thus, the height of the bending portions of the optical fibers 22 is set compact. As a result, the height of the optical connector 3A can be reduced.

The present invention is not limited to the above-described embodiments, and various modifications are possible within the scope of the present invention.

In the first embodiment, the fixing block 34 is used to fix the support block 23 to the base 21 in a removable manner. However, the structure for fixing the support block 23 to the base 21 is not limited to this. The fixing structure is not limited as long as the support block 23 can be attached to the base 21 in a removable manner, and the relative position between the optical waveguides 27 and the optical fibers 22 can be maintained.

In the first embodiment, the guide pin 28 and the guide hole 32 is used to fix the base 21 and the support block 23. However, the guide structure are not limited to this. For example, a project and a recess provided on the surfaces of the base and the support block may be used to fix them.

In the first embodiment, the grating couplers 13 are explained as a light coupling portion 9. However, the light coupling portion is not limited to this. For example, the light coupling portions may be photodiodes mounted on the silicon photonics device, or may be laser elements, such as vertical cavity surface emitting lasers (VCSEL), mounted on the silicon photonics device.

Although the base 21 and the support block 23 are fixed together by means of adhesive resin in the re-fixing step according to the first embodiment, the re-fixing method is not limited to this. In the re-fixing step, the base 21 and the support block 23 may be fixed together by a method other than the resin.

Principles of the present invention have been described on the basis of preferred embodiments with reference to the drawings. However, those skilled in the art will understand that the embodiments can be changed in terms of details without departing from the principles. Therefore, all the modifications and changes within the scope and the spirit of Claims are claimed as the present invention.

What is claimed is:

1. A method for manufacturing an optical assembly including an optical device optically coupling to an optical fiber, comprising the steps of:
   preparing an optical connector including a base having an optical waveguide, and a first support block holding a first optical fiber, the base having a first end surface and a second end surface opposed to the first end surface;
   aligning the optical connector so as to optically connect the optical waveguide of the base to the optical device while the first end surface of the base is faced to the optical device, the first support block being fixed to the base of the optical connector in a removable manner;
   after aligning the optical connector, fixing the base of the optical connector to the optical device;
   after fixing the base to the optical device, removing the first support block from the base;
   after removing the first support block, re-fixing a second support block holding a second optical fiber to the base while the second end surface of the base is faced to the second support block so as to optically connect the optical waveguide to the second optical fiber, wherein
   the optical waveguide is exposed at the first and second end surfaces,
   the first and second support blocks each have a through hole,
   the base has a guide pin, and
   in the step of re-fixing the second support block to the base, the second support block is fixed to the base by inserting the guide pin of the base into the through hole of the second support block.

2. The method according to claim 1 further comprising, after the step of removing the first support block, and before the step of re-fixing the second support block,
   a step of assembling the optical device with an electrical component.

3. The method according to claim 1, wherein the optical device includes a photodiode, and
   in the step of aligning the optical connector, the optical waveguide of the base is aligned to the optical device by receiving a light introduced into the first optical fiber with the photodiode.

4. The method according to claim 1, wherein
   the first support block includes a third end surface facing to the base, and a fourth end surface opposed to the third end surface,
   in the step of aligning the optical connector, the first support block is fixed to the base by attaching a fixing block on the fourth end surface,
   the fixing block has a first hole corresponding to the guide pin of the base, a second hole intersecting with the first hole, and a first pin inserted in the second hole, and
   the guide pin of the base is fixed in the first hole of the fixing block by the first pin inserted through the second hole.

5. The method according to claim 1, wherein, in the step of re-fixing the second support block to the base,
   the base is fixed to the second support block by using an adhesive resin.

6. The method according to claim 1, wherein the second support block includes a third end surface facing to the base, a fourth end surface opposed to the third end surface, and a protecting plate,
   the protecting plate is disposed above the fourth end surface, the second optical fiber protrudes from the fourth end surface extending in a first direction, and the protecting plate changes a direction in which the second optical fiber extends from the first direction to a second direction intersecting with the first direction.

7. The method according to claim 1, wherein the optical device includes a plurality of photodiodes and a plurality of modulators, the base includes a plurality of optical waveguides optically connected to the plurality of photodiodes or the plurality of modulators, the first support block includes a plurality of first optical fibers, the second support block includes a plurality of second optical fibers, the plurality of optical waveguides are optically connected to the plurality of first or second optical fibers, and in the step of aligning the optical connector, one of the plurality of photodiodes is used for alignment by receiving a light introduced into one of the plurality of first optical fibers.

8. The method according to claim 1, wherein the second support block is the same as the first support block.

* * * * *